(12) United States Patent
Deng

(10) Patent No.: US 7,214,474 B2
(45) Date of Patent: May 8, 2007

(54) WASH COMPOSITION WITH POLYMERIC SURFACTANT

(75) Inventor: Hai Deng, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/881,780

(22) Filed: Jun. 29, 2004

(65) Prior Publication Data

US 2005/0287478 A1    Dec. 29, 2005

(51) Int. Cl.
*G03F 7/30* (2006.01)
*G03F 7/32* (2006.01)

(52) U.S. Cl. .............. 430/325; 430/326; 430/331; 516/67; 516/74; 516/75; 516/203; 516/204

(58) Field of Classification Search ........... 430/326, 430/325, 331; 516/67, 74, 75, 203, 204
See application file for complete search history.

(56) References Cited

U.S. PATENT DOCUMENTS

| | | | |
|---|---|---|---|
| 4,370,406 A | * | 1/1983 | Jones ................ 430/331 |
| 5,962,186 A | | 10/1999 | Park et al. |
| 6,451,510 B1 | * | 9/2002 | Messick et al. ........ 430/311 |
| 6,472,136 B2 | * | 10/2002 | Tan et al. ............. 430/544 |
| 2005/0221236 A1 | * | 10/2005 | Akiyama et al. ........ 430/330 |

FOREIGN PATENT DOCUMENTS

| | | | |
|---|---|---|---|
| EP | 1396527 A1 | * | 3/2004 |
| JP | 56142528 A | * | 11/1981 |
| JP | 02051592 A | * | 2/1990 |

OTHER PUBLICATIONS

Christopher L. Soles et al., Polymer dynamics and diffusive properties in ultra-thin photoresist films, Proceedings of SPIE—The International Society of Optical Engineering, 11 pages, Feb. 2003, Santa Clara, CA.

* cited by examiner

*Primary Examiner*—John S. Chu
(74) *Attorney, Agent, or Firm*—Schwabe, Williamson & Wyatt, P.C.

(57) ABSTRACT

A wash composition that includes a polymeric surfactant and methods for using the wash composition are described herein.

24 Claims, 3 Drawing Sheets

WASH COMPOSITION WITH POLYMERIC SURFACTANT

BACKGROUND OF THE INVENTION

1. Field of the Invention

The present invention relates to, but is not limited to, electronic devices, and in particular, to the field of electronic device manufacturing.

2. Description of Related Art

In the current field of semiconductor manufacturing, a photolithography process is often used to form a photoresist pattern on a substrate of a die or a wafer. The resulting photoresist pattern may be used to etch circuitry and/or electronic component features onto the substrate.

In brief, a photolithography process typically involves initially depositing a photoresist composition on top of the substrate to form a photoresist film on the substrate. A patterning mask is then placed on top of the photoresist film leaving certain portions of the photoresist film exposed while leaving other portions unexposed. The exposed portions may then be exposed to an electromagnetic radiation source (e.g., light source) that generates electromagnetic radiation of specific wavelength or range of wavelengths in order to initiate chemical reactions within the exposed portions of the photoresist film.

As a result of these reactions, the exposed portions become either removable or not removable (depending on whether the photoresist film is a positive or negative type photoresist) in subsequent processes such as a wash process that may further include separate develop and rinse processes. For lack of a better term and for purposes of this description, the process of exposing the photoresist film to the electromagnetic radiation will be called an "exposure curing" process. After the completion of the exposure curing process, the wash process may be performed in order to remove the removable portions of the photoresist film. As a result, a photoresist pattern is formed on top of the substrate.

The formed photoresist pattern, in turn, may be subsequently used as an etching mask in order to form circuitry and/or electronic component features on the substrate. Although not described above, additional procedures such as baking and/or heating procedures may also be performed during the various stages of the photoresist patterning process.

Typically the formulation of a photoresist composition used for a photolithography process may vary depending on various design criteria. That is, the formulation of a photoresist composition may depend on the size of the circuitry or electronic components being formed or patterned. As circuitry and electronic components become smaller, the formulation of the photoresist composition will likewise change in order to meet the changing manufacturing requirements for producing the circuitry features used to form these smaller components. For example, if a via or a trace is being formed then the formulation of the photoresist composition may depend upon the size, such as the node width, of the via or the trace being formed. Each of the photoresist composition formulations is typically identified by the wavelength of the corresponding electromagnetic radiation (e.g., light) used to exposure cure the photoresist. For example, a photoresist composition may be identified as 365 nanometer (nm) photoresist (I-line), a 248 nm photoresist (called deep UV or DUV), a 193 nm photoresist, 157 nm photoresist, and the like. Commercial suppliers typically sell these photoresist types.

As electronic components have become smaller, one problem faced by semiconductor device manufacturers is the problem of pattern collapse or photoresist pattern collapse. It has been proposed that pattern collapse occurs as a result of the photoresist development process when a developer solution or rinse solution (DI water) "pulls down" the photoresist lines. In order to avoid such problems, it is known to add surfactants to the developer or rinse solutions to reduce collapse. However, such solutions may have certain drawbacks.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Figure 1:
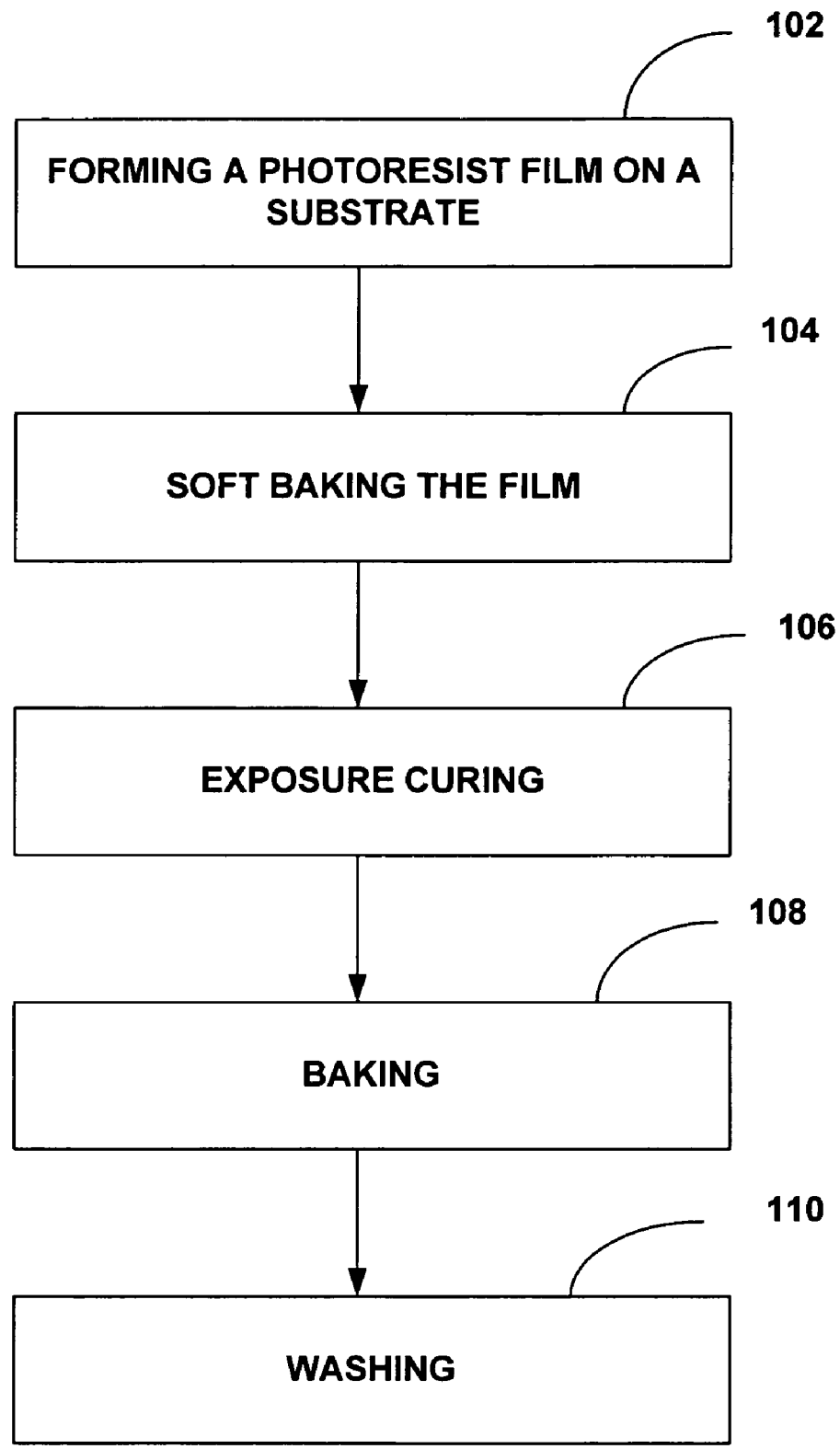
FIG. 1 illustrates a process for forming photoresist patterns according to some embodiments of the invention.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention.

The following description includes terms such as on, onto, on top, and the like, that are used for descriptive purposes only and are not to be construed as limiting. That is, these terms are terms that are relative only to a point of reference and are not meant to be interpreted as limitations but are instead, included in the following description to facilitate understanding of the various aspects of the invention.

According to various embodiments of the invention, wash compositions with polymeric surfactants and methods for using the same are provided. For the embodiments, the wash compositions may be used during the wash process (e.g., develop and rinse processes) of a photolithography process to reduce the likelihood of the resulting photoresist pattern collapsing. In various embodiments, the wash compositions may be comprised of at least 1 percent by weight of polymeric surfactants and in some embodiments, between about 1 and about 8 percent by weight of the polymeric surfactant.

According to various embodiments, the polymeric surfactants may reduce the surface tension or energy of the photoresist polymer line being patterned. Further, in various embodiments, the polymeric surfactants may form a thin layer on the resist line surface to prevent interaction between the resist material and subsequent processes. Further yet, in some embodiments, the polymeric surfactants may make the resist lines mechanically stronger by combining with the resist material.

In various embodiments, the polymeric surfactants may be amphilphilic polymers having both hydrophobic and hydrophilic sections. For the embodiments, the polymeric surfactants may not penetrate into the photoresist film thus reducing the likelihood of defects from forming in the photoresist pattern being formed. That is, for these embodiments, the polymeric surfactants may have larger molecular structures that may prevent the surfactants from penetrating deep into the photoresist film. In some embodiments, the polymer surfactants may be polymeric surfactants that include at least two different surfactant units. By adding polymer surfactants with multiple surfactant units in, for example, a wash composition of a photolithography process, the polymer surfactants may be effective over a wide range of photoresist formulations.

The polymeric surfactants may be, for example, block copolymers, random graft copolymers, and/or polysoaps (graft copolymer of surfactant units). Examples of copolymeric surfactants appropriate for such purpose include, for example, poly(dodecylacrylate-co-sodium acrylate), poly(styrene-co-α-methylstyrene-co-acrylic acid), poly(acrylic acid-co-methyl methacrylate), and poly(acrylic acid) with hydrophobic modifications. An example of a graft copolymer appropriate for such purpose include, for example, poly(vinyinaphtalene-alt-maleic acid)-g-polystyrene. An example of a polysoap appropriate for such purpose include, for example, a polysoap having the structure:

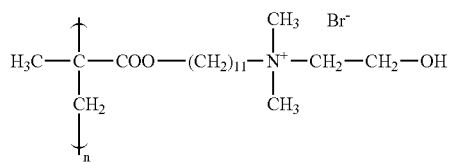

In various embodiments, the polymeric surfactants may include two or more different surfactant units that are chemically linked. In some embodiments, such polymeric surfactants may be polysoaps that includes two different surfactant units. For example, a two-surfactant unit polysoap appropriate for such purposes may have, for example, the structure:

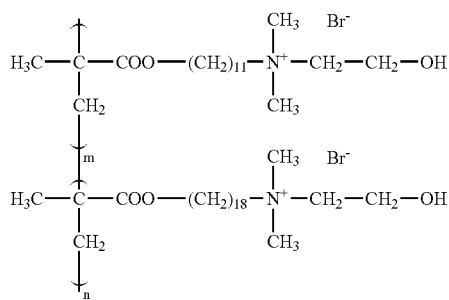

Such a polymeric surfactant structure may allow the polymeric surfactant to be effective in reducing surface energy associated with multiple photoresist formulations.

In brief, the addition of polymeric surfactants to wash compositions used in, for example, photolithography processes, may provide at least two advantages according to some embodiments. First, in some embodiments, a polymeric surfactant may reduce the surface tension or energy of the photoresist film that is washed during the wash stage of the photolithography process without affecting the underneath photoresist polymer structure. That is, if a non-polymer surfactant is used rather than a polymer surfactant in a wash composition, the non-polymer surfactant may penetrate into the photoresist film and react to resist components, such as photo-acid generator (PAG), quencher, polymer or other additives, during the wash process. Such interaction may result in defects forming within the photoresist film and may ultimately result in the formation of a defective photoresist pattern. By using a polymeric surfactant, such problems may be avoided. Second, in some embodiments in which the polymeric surfactant is made of more than one surfactant unit, the polymeric surfactant may be more effective than nonpolymeric surfactant against a greater range of photoresist formulations. Also, for these embodiments, the polymeric surfactant may act like glue to strengthen the resist line.

Referring to FIG. 1 depicting a process for forming a photoresist pattern according to some embodiments. For the embodiments, the process 100 may begin when a photoresist film is formed on top of a substrate at block 102. The substrate may be a die or a wafer. In various embodiments, the photoresist film may be a 365 nanometer (nm) photoresist (I-line), a 248 nm photoresist (called deep UV or DUV), a 193 nm photoresist, 157 nm photoresist, and the like. Note that although the process 100 is associated with a positive photoresist, in other embodiments, various aspects of the process 100 may be implemented with a negative type photoresist.

After a photoresist film has been formed on the substrate, a soft-bake of the film may be performed in order to, for example, remove solvents that may have been included in the photoresist composition according to some embodiments at block 104. For these embodiments, this may be done at a temperature of about 90° Celsius (C.) to about 150° C. for 30 to 120 seconds on a hot plate, for example. Actual baking time and temperature may, of course, depend upon the formulation of the photoresist composition. A patterning mask may then be placed on top of the photoresist film exposing certain portions of the photoresist film while leaving other portions unexposed. The photoresist film may then be exposure cured using, for example, electromagnetic radiation, which may initiate a chemical reaction within the exposed portions of the photoresist film at block 106. The specific radiation wavelengths used during the exposure curing process may depend upon the specific formulation of the photoresist composition used to form the photoresist film.

According to some embodiments, following the exposure curing process, the patterning mask may be removed from the substrate (and the photoresist film) and the substrate may be baked (i.e., post exposure bake or PEB) for about 1 to 2 minutes at 70° to 150° C. to amplify the latent image formed from the preceding masking and exposure curing processes at block 108. Following the baking procedure, a wash process may be performed to at least the exposed portions of the photoresist film at block 110. The wash process may remove removable portions (e.g., exposed portions for a positive type photoresist) of the photoresist film. In various embodiments, the wash process may include a sequence of separate develop and rinse operations using different wash compositions.

Wash processes may be employed in order to remove unwanted materials such as the exposed portions (or the unexposed portions if a negative photoresist is used) of the photoresist film. A wash composition may be of any composition that may be used during the wash process, which may involve separate developing and rinsing operations. Depending on whether a wash composition is being used for the developing or rinsing portions of the wash process, the composition of the wash composition may vary. In various embodiments, the wash process may involve the use of multiple wash compositions with different formulations.

In general, a wash composition may include one or more types of polymer surfactants such as those described previously. Depending on its use, a wash composition may further include a developing composition, a rinsing composition or any other solvent base such as pure or ionized water that may be used during the wash process. A more detailed discussion relating to the wash process is provided below.

According to some embodiments, a wash composition used for a developing operation of the wash process includes a developing composition and may include polymeric surfactants. In various embodiments, the developing composition may be an aqueous composition. For example, in some embodiments, the developing composition may be formed with a developer, for example, tetramethyl ammonium hydroxide (TMAH), in a solvent, such as water. In various embodiments, the developing composition may be at least a 0.2 normal (N) developing composition solution. In some embodiments, the developing composition solution may be about a 0.21 to about 0.26 N solution. Other acceptable developers include, for example, trimethyl 2-hydroxyethyl ammonium hydroxide, tetraethylammonium hydroxide, tetrapropylammonium hydroxide, tetrabutylammonium hydroxide, methyltriethylammonium hydroxide, trimethylethylammonium hydroxide, dimethyidiethylammonium hydroxide, triethyl (2-hydroxyethyl) ammonium hydroxide, dimethyldi (2-hydroxyethyl) ammonium hydroxide, diethyidi (2-hydroxyethyl) ammonium hydroxide, methyltri (2-hydroxyethyl) ammonium hydroxide, ethyltri (2-hydroxyethyl)ammonium hydroxide, and tetra(2-hydroxyethyl)ammonium hydroxide.

According to some embodiments, a wash composition used during a rinsing operation of the wash process includes a rinsing composition and may include polymeric surfactants. In some embodiments, the rinsing composition may be an aqueous composition or may simply be pure and/or ionized water.

The wash process 110 depicted in FIG. 1 may include a sequence of develop and rinse operations involving different wash compositions. One or more types of polymer surfactants may be added to one or more of the different wash compositions according to various embodiments. For purposes of this description, a develop operation may be performed to develop at least a portion (e.g., exposed portion since in these embodiments the photoresist is a positive photoresist) of the photoresist film. A rinse operation, on the other hand, may be employed to remove unwanted portion or portions (e.g., exposed portions) of the photoresist film or to simply contact the photoresist film to a rinse wash composition.

Figure 2:
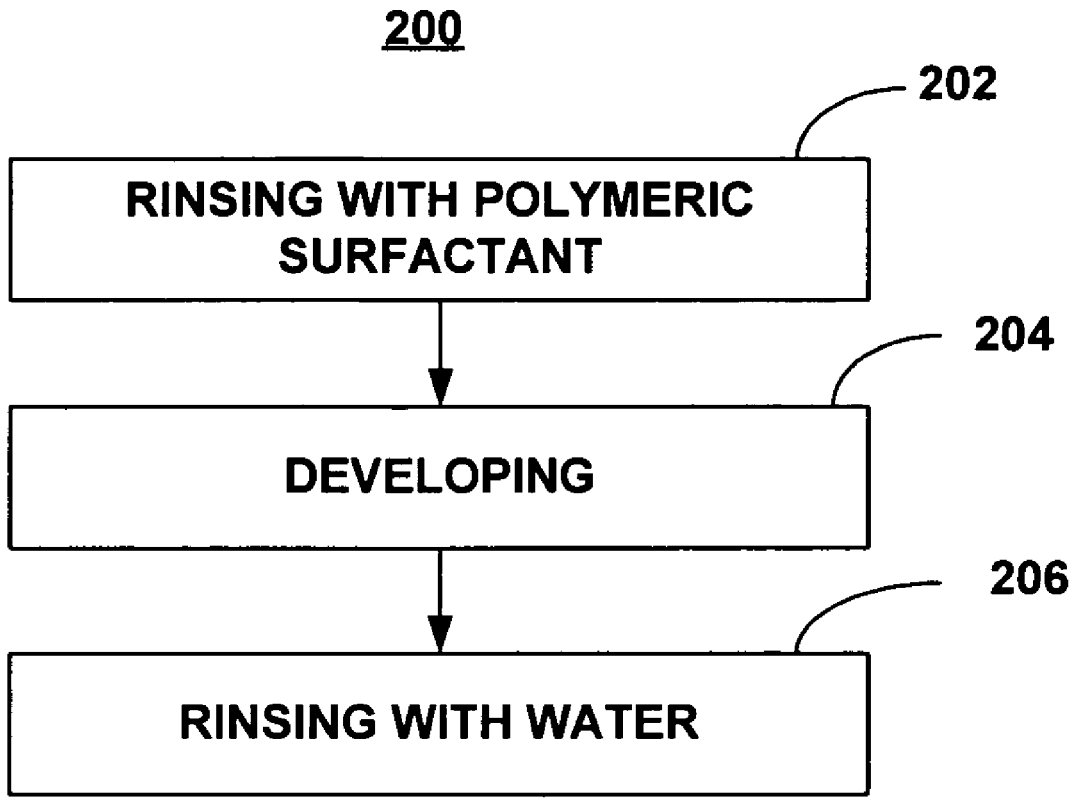
FIG. 2 illustrates a wash process according to one embodiment.

Referring to FIG. 2 depicting a wash process according to one embodiment. For the embodiment, the process 200 begins with a rinse operation that includes rinsing at least the portion of the photoresist film that was exposure cured with a first wash composition comprising one or more types of polymeric surfactants at block 202. The first wash composition may further include a base rinsing composition such as water (deionized and/or purified). Note that in this description, the word "composition" is broadly defined and may be used in reference to pure materials such as pure water. After rinsing the photoresist film, a develop process may be performed in which a second wash composition is placed on or contacted with the photoresist film at block 204. For the embodiment, the second wash composition may be comprised of a developing composition such as the developing compositions described previously. In this embodiment, the second wash composition will not include a polymer surfactant. After the develop process, a rinse process using water may be performed at block 206. Such a rinse process may, for example, remove unwanted materials (e.g., exposed portions of the photoresist film) from the substrate and the portions of the photoresist film that remain (e.g., the nonsoluble portions of the photoresist film) after the wash process.

Figure 3:
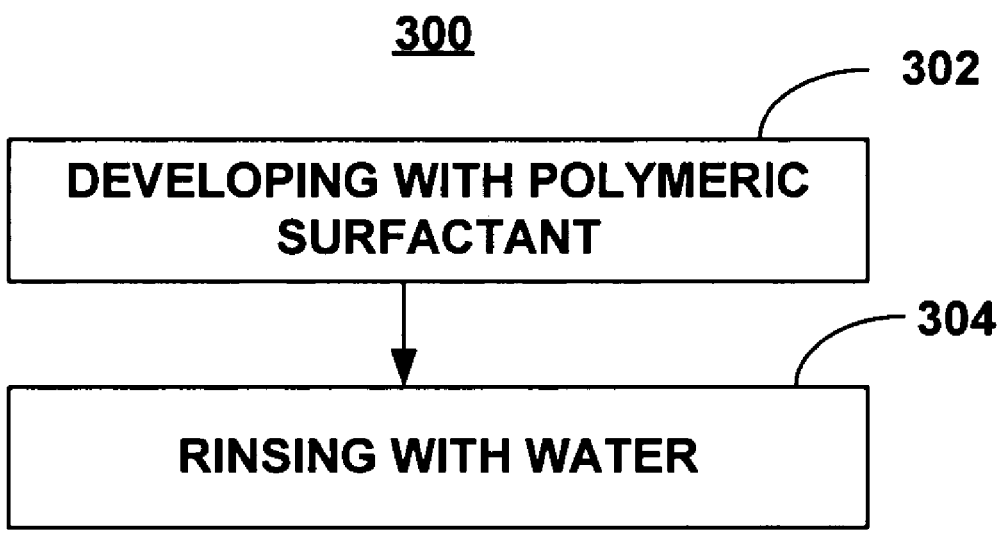
FIG. 3 illustrates another wash process according to another embodiment.

Referring to FIG. 3 depicting a wash process according to another embodiment. For the embodiment, the process 300 begins with a develop process in which a wash composition that includes a base developing composition and one or more types of polymeric surfactants is placed on or contacted with at least the exposed portions of the photoresist film at block 302. Next, a rinse process that includes rinsing at least the exposed (and developed) portions of the photoresist film with water (purified and/or deionized) may be performed at block 304.

Figure 4:
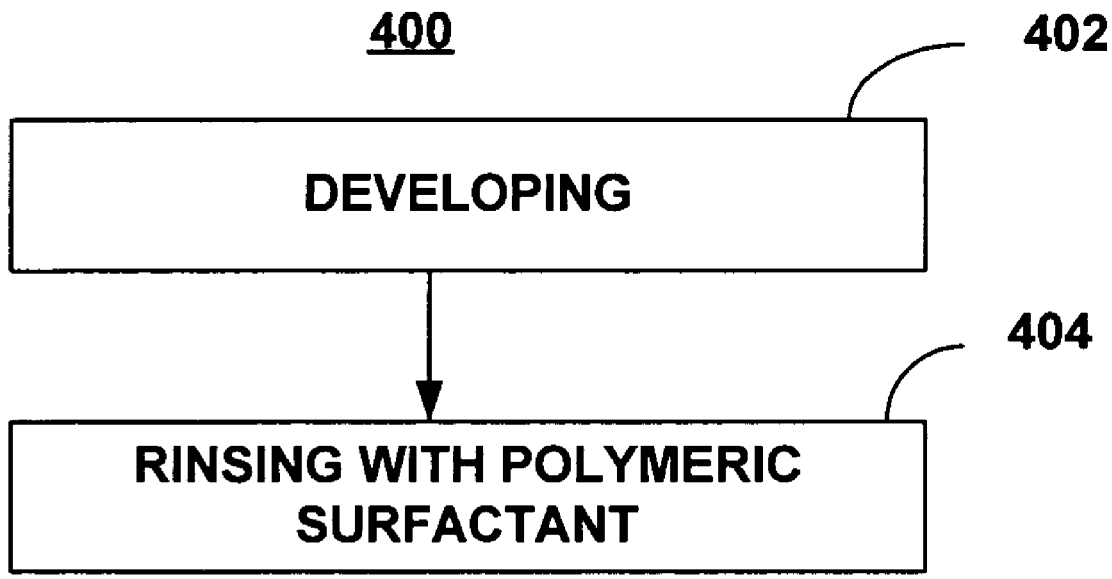
FIG. 4 illustrates another wash process according to another embodiment.

Referring to FIG. 4 depicting a wash process according to yet another embodiment. For the embodiment, the process 400 begins with a develop process in which a first wash composition is placed on or contact with the at least partially exposed photoresist film at block 402. For the embodiment, the first wash composition includes a developing composition but does not include a polymeric surfactant. Next, a rinse operation may be performed using a second wash composition that does include one or more types of polymeric surfactants at block 404. In this embodiment, the second wash composition may further include a base rinse composition such as water. The rinse operation includes placing on or contacting the second wash composition to at least the exposed (and developed) portions of the photoresist film.

Figure 5:
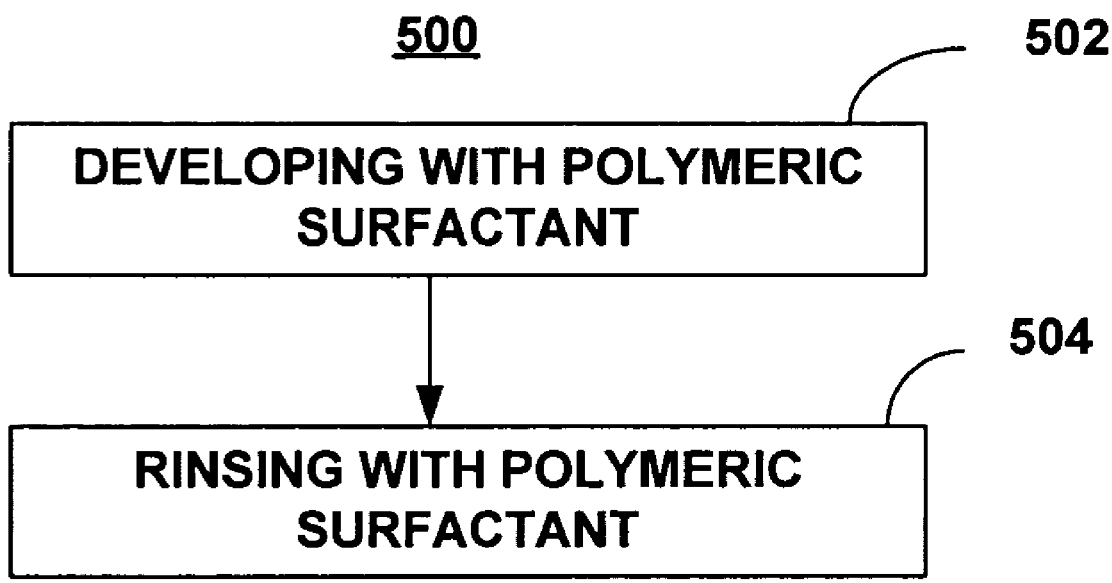
FIG. 5 illustrates another wash process according to another embodiment.

Referring to FIG. 5 depicting a wash process according to yet another embodiment. For the embodiment, the process 500 begins with a develop process in which a first wash composition is placed on or contact with at least the exposed portions of the photoresist film at block 502. For the embodiment, the first wash composition includes a base developing composition and one or more types of polymeric surfactants. Next, a rinse process may be performed using a second wash composition that also includes one or more types of polymeric surfactants at block 504. The rinse process includes placing on or contacting the second wash composition at least on the exposed portions of the photoresist film. The second wash composition may include, in addition to the polymeric surfactant, a base rinse composition such as purified and/or ionized water.

According to various embodiments, the wash compositions discussed above may be contacted or placed onto the photoresist film using several different techniques. These techniques or methods include, for example, puddle, immersion, quiescence, and spray methods. The following are examples of how various wash compositions may be placed onto a substrate containing the at least partly exposed photoresist film. Note that in the following examples, each of the wash compositions described may or may not include the polymeric surfactants described previously.

In the first example, a puddle method is used to contact or place a first wash composition containing a developing composition onto a substrate. In this example, the first wash composition containing the developing composition is puddled onto the substrate. The substrate is then spun to distribute the first wash composition over the substrate surface. The first wash composition may then be left on the substrate surface for sufficient development time to develop the photoresist pattern. A second wash composition that is a rinse may then be puddled onto the still wet substrate surface while the substrate is at rest. Once the second wash composition has been puddled, the substrate may be spun to rinse the substrate. After the rinsing procedure, the rinsed substrate may be dried by spin-drying, for example.

In the second example, an immersion method is used to apply a wash composition. In this example, the substrate is dipped into a bath of a first wash composition containing a developing composition for a specified time period. The substrate is then removed from the immersion bath and is then immersed in a second wash composition (a rinse) bath. Alternatively, a displacement rinse method may be used using the same tank for both the development and rinsing operations. In other embodiments, instead of immersing the developed substrate, the immersed substrate may be rinsed by spraying.

In the third example, a quiescence method is used to apply a wash composition to a substrate. In this example, a first wash composition that includes a developing composition is initially placed onto the substrate surface. After sufficient time to develop the photoresist pattern, a second wash composition (rinse) is added to the substrate surface. After rinsing, the substrate may then be dried.

In the fourth example, a spray method is used to apply a wash composition to a substrate. In this example, the substrate may be sprayed with a first wash composition containing a developing composition for a certain time period to develop the pattern, for example, for about 1 to 2 minutes. The developed substrate may then be sprayed with a second wash composition (rinse) to rinse the first wash composition from the substrate surface. The substrate is then dried using various drying techniques.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. A method, comprising:
   providing a photoresist film on a substrate;
   exposing at least a portion of the photoresist film; and
   contacting a wash composition to at least the exposed portion of the photoresist film, the wash composition comprising a first polymeric surfactant, wherein the first polymeric surfactant is a polymer selected from the group consisting of poly(dodecylacrylate-co-sodium acrylate), poly(styrene-co-α-methylstyrene-co-acrylic acid), poly(acrylic acid-co-methyl methacrylate), poly(acrylic acid) with hydrophobic modifications, poly(vinylnaphtalene-alt-maleic acid)-g-polystyrene, and a polysoap having the structure:

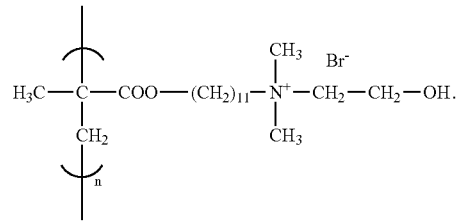

2. The method of claim 1, wherein the first polymeric surfactant comprises at least two different surfactant units.

3. The method of claim 1, wherein the wash composition further comprises a second polymeric surfactant having a different chemical structure than the first polymeric surfactant.

4. The method of claim 3, wherein said first polymeric surfactant reduces surface energy associated with a first photoresist composition and said second polymeric surfactant reduces surface energy associated with a second photoresist composition.

5. The method of claim 1, wherein the wash composition further comprises an aqueous composition.

6. The method of claim 5, wherein the aqueous composition is a developing composition.

7. The method of claim 6, further comprising:
   contacting the at least exposed portion of the photoresist film with a rinsing composition after contacting the at least exposed portion of the photoresist film with the wash composition.

8. The method of claim 5, wherein the aqueous composition is a rinsing composition.

9. The method of claim 8, further comprising:
   contacting a developing composition prior to contacting the wash composition to the at least exposed portion of the photoresist film.

10. The method of claim 1, further comprising:
    contacting a developing composition to the at least exposed portion of the photoresist film after contacting the wash composition to the at least exposed portion of the photoresist film.

11. The method of claim 10, further comprising:
    contacting a rinsing composition to the at least exposed portion of the photoresist film after contacting the developing composition to the at least exposed portion of the photoresist film.

12. The method of claim 1, wherein the contacting comprises
    contacting the wash composition to the photoresist film using a puddle method.

13. A wash composition, comprising:
    a developing composition including a solution of a developer, the solution having a normality of at least 0.2; and
    at least 1 percent by weight of a first polymeric surfactant, wherein the first polymeric surfactant is a polymer selected from the group consisting of poly(dodecylacrylate-co-sodium acrylate), poly(styrene-co-α-m ethylstyrene-co-acrylic acid), poly(acrylic acid-co-methyl methacrylate), poly(acrylic acid) with hydrophobic modifications, poly (vinylnaphtalene-alt-maleic acid)-g-polystyrene, and a polysoap having the structure:

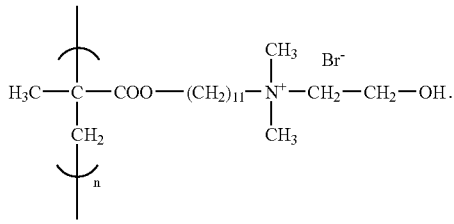

14. The wash composition of claim 13, wherein the first polymeric surfactant combines with the developing composition to form a wash composition that prevents photoresist pattern collapse.

15. The wash composition of claim 13, wherein the wash composition reduces surface tension.

16. The wash composition of claim 13, wherein the wash composition strengthens resist lines by depositing a layer of polymer on the resist lines when the wash composition is in contact with the resist lines.

17. The wash composition of claim 13, wherein the first polymeric surfactant is a polymer selected from the group consisting of a block copolymer, a random graft copolymer, and a polysoap.

18. The wash composition of claim 13, wherein the first polymeric surfactant comprises at least two different surfactant units.

19. The wash composition of claim 13, further comprises a second polymeric surfactant having a different chemical structure than the first polymeric surfactant.

20. The wash composition of claim 19, wherein said first polymeric surfactant reduces surface energy associated with a first photoresist composition and said second polymeric surfactant reduces surface energy associated with a second photoresist composition.

21. The composition of claim 13, wherein the developer is a developer selected from the group consisting of tetramethyl ammonium hydroxide (TMAH), trimethyl 2-hydroxyethyl ammonium hydroxide, tetraethylammonium hydroxide, tetrapropylammonium hydroxide, tetrabutylammonium hydroxide, methyltriethylammonium hydroxide, trimethylethylammonium hydroxide, dimethyldiethylammonium hydroxide, triethyl (2-hydroxyethyl) ammonium hydroxide, dimethyldi (2-hydroxyethyl) ammonium hydroxide, diethyldi (2-hydroxyethyl) ammonium hydroxide, methyltri (2-hydroxyethyl) ammonium hydroxide, ethyltri (2-hydroxyethyl) ammonium hydroxide, and tetra (2-hydroxyethyl) ammonium hydroxide.

22. The composition of claim 21, wherein the developing composition comprises an aqueous solution of tetramethyl ammonium hydroxide (TMAH).

23. The composition of claim 13, wherein the solution has a normality between about 0.21 and about 0.26.

24. The composition of claim 13, wherein the developing composition comprises an aqueous solution of the developer.

* * * * *

UNITED STATES PATENT AND TRADEMARK OFFICE
CERTIFICATE OF CORRECTION

PATENT NO. : 7,214,474 B2  Page 1 of 1
APPLICATION NO. : 10/881780
DATED : May 8, 2007
INVENTOR(S) : Hai Deng It is certified that error appears in the above-identified patent and that said Letters Patent is hereby corrected as shown below:

Column 8
Lines 61-62, Claim 13 "...-m ethylstyrene-..." should read --...-methylstyrene...--.

Signed and Sealed this

Sixteenth Day of September, 2008

JON W. DUDAS
*Director of the United States Patent and Trademark Office*